United States Patent [19]
Glants

[11] Patent Number: 5,837,059
[45] Date of Patent: Nov. 17, 1998

[54] AUTOMATIC POSITIVE PRESSURE SEAL ACCESS DOOR

[75] Inventor: Alex Glants, Brookline, Mass.

[73] Assignee: Brooks Automation, Inc., Chelmsford, Mass.

[21] Appl. No.: 891,550

[22] Filed: Jul. 11, 1997

[51] Int. Cl.$^6$ .................................................. C23C 16/00
[52] U.S. Cl. .......................................... 118/733; 414/217
[58] Field of Search ............................. 118/733; 414/217

[56] References Cited

U.S. PATENT DOCUMENTS

| | | | |
|---|---|---|---|
| 5,013,385 | 5/1991 | Maher et al. | 156/345 |
| 5,186,594 | 2/1993 | Toshima et al. | 414/217 |
| 5,512,320 | 4/1996 | Turner et al. | 427/255 |
| 5,607,276 | 3/1997 | Muka et al. | 414/331 |

FOREIGN PATENT DOCUMENTS

WO 94/23911   10/1994   WIPO .

*Primary Examiner*—Richard Bueker
*Attorney, Agent, or Firm*—Perman & Green, LLP

[57] ABSTRACT

A novel automatic vertical-slide door assembly for a supply chamber, and a substrate-processing apparatus incorporating such a door assembly for sealing engagement in the presence of either negative or positive pressure, such as atmospheric pressure, within the supply chambers or load locks and the central transfer station. The present door assemblies are relatively thin and vertically movable to fully cover and uncover the access port or opening to the load lock chamber, and a section thereof is also horizontally-movable a slight distance into compression against the face surface of the load lock to seal the load lock against leakage of either positive or negative pressure, while avoiding any frictional sliding contact with the face surface of the load lock or with the sealing gasket surrounding the access port or opening thereto during vertical operation thereof.

10 Claims, 5 Drawing Sheets

AUTOMATIC POSITIVE PRESSURE SEAL ACCESS DOOR

BACKGROUND OF THE INVENTION

1. Field of the Invention

The present invention relates to automatic door seals, such as on a substrate processing apparatus and, more particularly, to access doors to a workpiece supply compartment in communication with a sterile processing compartment of such an apparatus.

2. Prior Art

U.S. Pat. Nos. 5,013,385, 5,512,320 and 5,607,276 disclose substrate processing apparati for automatically transferring substrates, such as semiconductor wafers or glass plates, from a supply compartment having a sterile atmosphere through a port and into a central transfer station for processing at plurality of treatment stations. The substrates preferably are stacked vertically within a sterile load lock supply chamber from which they are introduced to the central transfer station and into which they are returned after processing.

Reference is made to U.S. Provisional patent application Ser. No. 60/044,490, filed Apr. 21, 1997 in the name of Douglas R. Adams, titled "Substrate Processing Apparatus With Small Batch Load Lock", the disclosure of which is hereby incorporated by reference thereto. The Provisional application discloses an automatic material transfer processing apparatus of the general type in which the present automatic access doors advantageously can be incorporated to provide horizontal access to the supply compartments or load locks for the insertion of cassettes loaded with wafers or other substrates to be transferred and processed at one or more work stations or processing modules, and to permit horizontal removal of cassettes re-loaded with the wafers or substrates after they have been processed.

Automatic access doors are known on prior known substrate processing apparati of the present general type. However, such known doors have one or more disadvantages which make them unsuitable for use in processing machines of various types. Most known processing machines operate with the transfer station, load locks and processing modules under negative pressure in order to exclude contaminants, whereas it is more efficient in most instances to operate at sterile atmospheric pressure using inert gases and filtration systems to produce the same result, namely the exclusion of contaminants from the transfer station load locks and processing modules. The automatic access doors to the load locks on known substrate processing machines which operate under negative pressure will not provide an effective seal if the machines are operated at atmospheric or positive pressure since they do not include any positive pressure means for pressing the door against the opening. Instead they rely upon the internal vacuum pressure to draw the door into sealing pressure over the openings to the load locks.

Another problem with some known sealing doors is their bulk or thickness, which prevents their use in narrow spaces, such as between the load locks and the supply modules of the aforementioned Provisional application or on machines which are closely-mounted to each other.

Yet another problem with the doors on known substrate processing apparati is the lack of access to the inner surfaces thereof, for cleaning purposes, without major disassembly. This is an important disadvantage since the processing chamber atmosphere frequently contains chemical deposition and etching gases, which gases enter the load lock chambers and contaminate the inside surface of the sealant doors and the view ports thereon.

SUMMARY OF THE INVENTION

The present invention relates to a novel automatic vertical-slide door assembly and to a substrate-processing apparatus incorporating such a door assembly for sealing engagement in the presence of either negative or positive pressure, such as atmospheric pressure, within the supply chambers or load locks and the central transfer station. It is an important feature of the present door assemblies that they are relatively thin and vertically movable to fully cover and uncover the access port or opening to the load lock chamber, and that they are also horizontally movable a slight distance into compression against the face surface of the load lock to seal the load lock against positive or negative pressure while avoiding any frictional sliding contact with the face surface of the load lock or with the sealing gasket surrounding the access port or opening thereto during vertical operation thereof, and that they are pivotable to a cleaning position, when lowered, to provide full access to the inside surface thereof and facilitate the cleaning thereof.

BRIEF DESCRIPTION OF THE DRAWINGS

The foregoing aspects and other features of the present invention are explained in the following description, taken in connection with the accompanying drawings, wherein.

DETAILED DESCRIPTION OF THE PREFERRED EMBODIMENT

Figure 1:
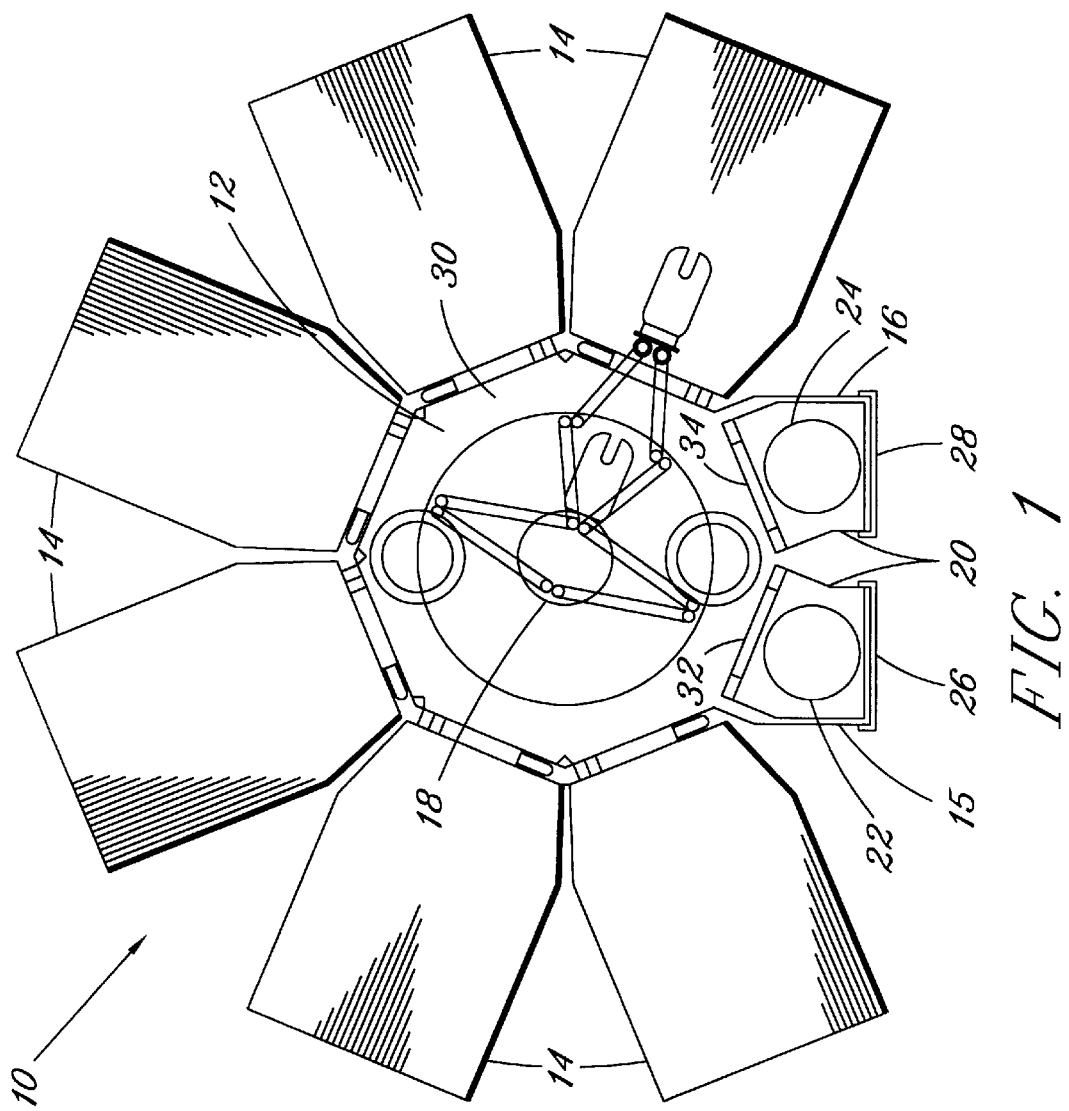
FIG. 1 is a schematic top plan view of a substrate processing apparatus incorporating automatic load lock access doors according to the present invention.

Referring to FIG. 1, there is shown an exploded perspective view of a substrate processing apparatus 10 incorporating features of the present invention. Although the present invention will be described with reference to the single embodiment shown in the drawings, it should be understood that the present invention can be embodied in many alternate forms of embodiments. In addition, any suitable size, shape or type of elements or materials could be used.

The apparatus 10 includes a main transfer section 12, a plurality of substrate processing modules 14 and a pair of load lock supply modules 15 and 16. The main section 12 has a substrate transport rotor arm 18 for moving substrates among the modules 14, 15 and 16. The substrate transport rotor arm 18 is substantially the same as the transfer device described in PCT patent publication No. WO 94/23911 which is hereby incorporated by reference in its entirety. However, any suitable type of programmable transport arm can be used. The chamber 30 formed by the main section 12 is maintained sterile in a vacuum or at atmospheric pressure with an inert gas. The substrate supply modules or load locks 15 and 16 are connected to a front end of the main section 12. The load locks 15 and 16 have a housing 20 and means for holding wafer or substrate cassettes 22 and 24. The substrate processing modules 14 are well known in the art and, therefore, will not be described further.

The front end of the main section 12 has the two supply modules or load locks 15, 16 secured thereto. The load locks function as substrate supply compartments for cassettes containing the substrates or wafers for automatic individual transfer to or from the chamber 30, namely, between a vacuum or inert atmospheric processing environment and a corresponding supply compartment environment which must be opened to ambient conditions to introduce cassettes of wafers for processing and to remove cassettes of processed wafers. The access doors 26, 28 to the load locks 15 and 16 are opened to ambient conditions to introduce or remove cassettes 22, 24 to the load locks in the horizontal direction. The processing chamber rotor arm 18 transports the substrates from the cassettes in the load locks 15, 16 radially and sequentially to the processing modules 14. Similarly, when the substrates are finished being processed, the processing chamber robot arm 18 transports the substrates from the modules 14 to the cassettes 22, 24 in the load locks 15, 16. Valves 32, 34 are actuated to seal the load locks 15,16 from the chamber 30, the load locks 15, 16 are decompressed and opened to ambient pressure, and vertical doors 26 or 28 are opened to remove the cassettes 22 or 24 without exposing chamber 30 or modules 14 to the ambient conditions. After new cassettes of substrates are inserted into the load lock chambers 15, 16 the doors 26, 28 are closed and sealed, the chambers 15, 16 are evacuated to vacuum or are filled with an inert gas at atmospheric or positive pressure, corresponding to the condition within the central transfer station chamber 30, and the valves 32, 34 are actuated to open the transfer ports between the load lock chambers 15, 16 and the transfer station chamber 30.

Figure 2:
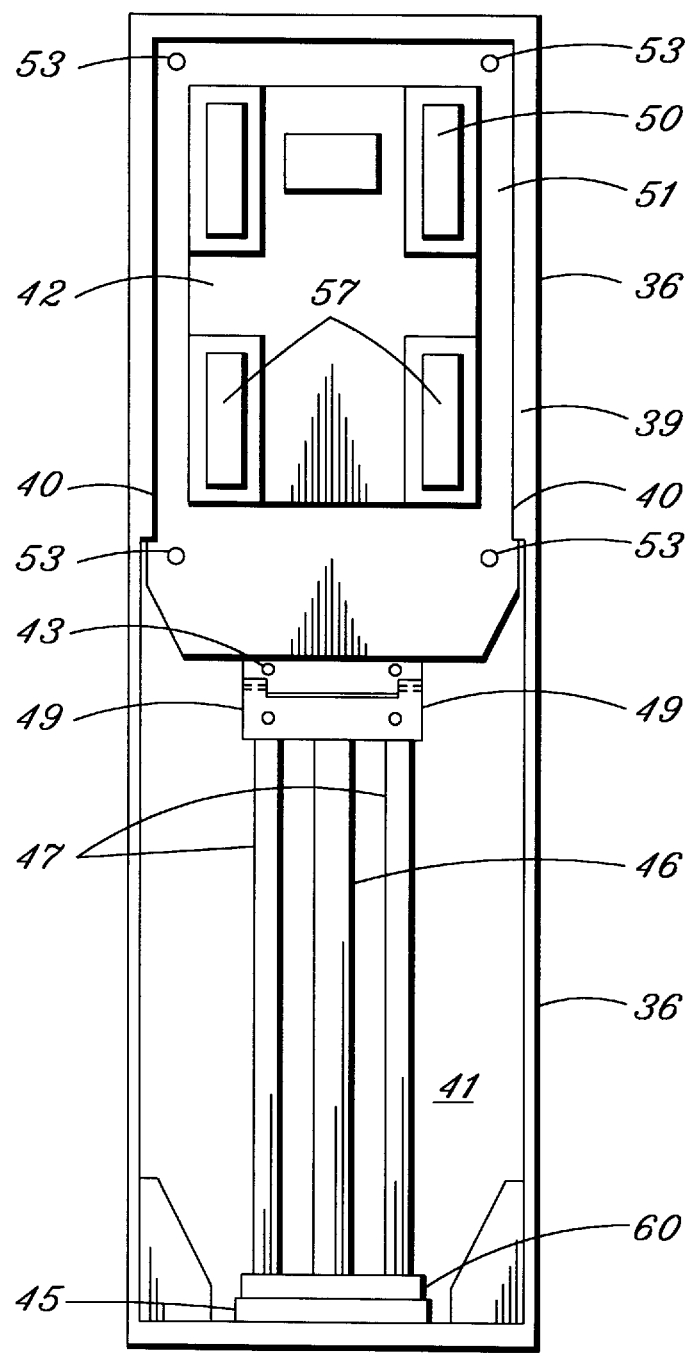
FIG. 2 is a vertical face view of an automatic door assembly according to an embodiment of the present invention, with the door shown in the raised or closed position.
Figure 3:
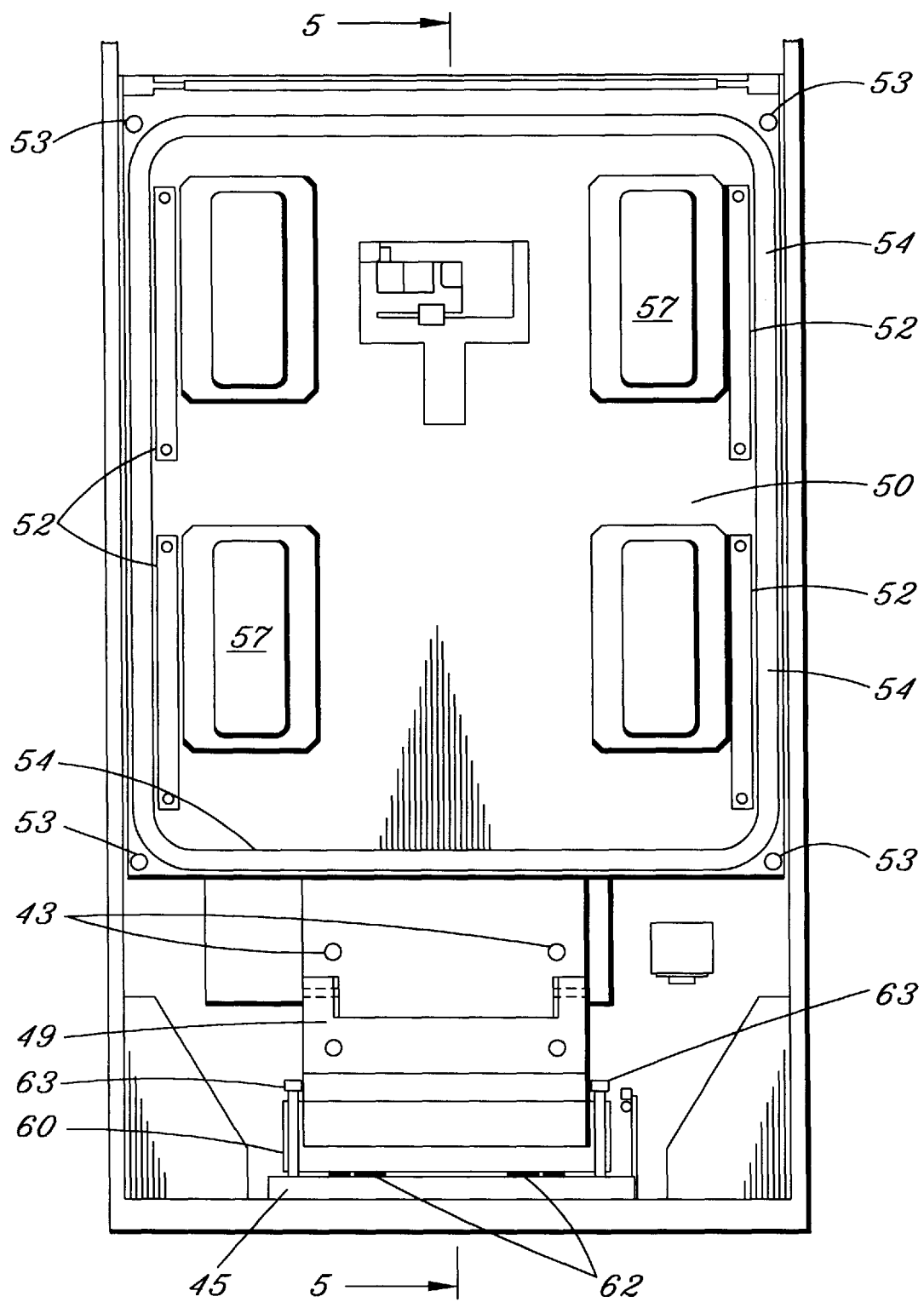
FIG. 3 is vertical partial face view of the door assembly of FIG. 2 with the door in the down or open position and with the outer door panel removed for illustration purposes.
Figure 4:
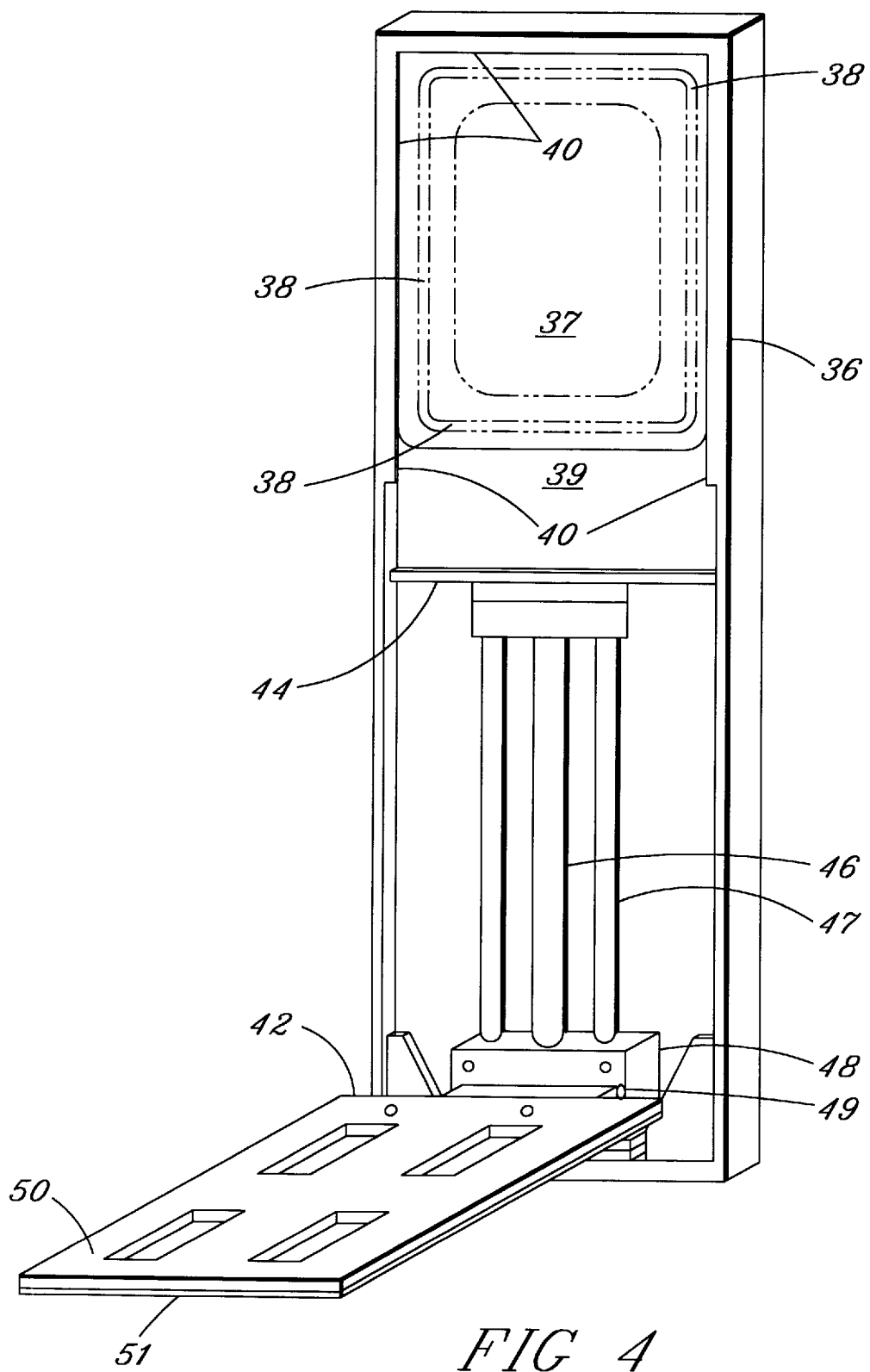
FIG. 4 is a vertical face view of the assembly of FIG. 2, with the door in the down position and pivoted outwardly to expose the sealing face for cleaning purposes.

FIGS. 2 to 4 illustrate the novel door assemblies 26,28 of the present invention. Each assembly 26,28 comprises a support frame 36 designed to be supported vertically on the floor and bolted to the chamber 20 of the load lock 15,16 so that the upper half 39 of the frame 36 encompasses the access port or opening 37 to the load lock 15,16, surrounded by the gasket 38, as shown in FIG. 4. The upper half 39 of the support frame 36 has a flange 40 which extends inwardly from to top and sides of the frame to reduce the width of the opening in the upper half 39 of the support frame 36 to a dimension less than the width of the opening in the lower half 41 of the frame 36 and less than the width of the door 42.

Mounted within the lower half 41 of the support frame 36 is a support assembly for a vertically-slideable door 42, which comprises an upper cross brace 44, a lower cross brace 45, a vertical pneumatic actuator cylinder 46, a pair of vertical guide rods 47, and a magnetic block 48 to which the slidable door 42 is fastened by means of a releasable hinge assembly 49. Actuation of the pneumatic cylinder 46 causes an internal piston to be forced up or down within the cylinder 46 and to transport the magnetic block, which is magnetically-coupled thereto, upwardly or downwardly over the cylinder 46 and rods 47 to move the door 42 between raised, closed position, shown in FIG. 2 and opened, lowered position, shown in FIG. 3.

When the door 42 is raised to upper position, shown in FIG. 2, it is contained beneath and closely-spaced from the side and top flange 40 of the support frame 36 since the width of the door 42 is greater than the width of the opening in the upper section 39 of the support frame 36, beyond the flange 40.

However, when the door 42 is moved vertically to the lower half 41 of the support frame 36, as shown in FIG. 3, it is no longer overlapped by the flange 40 and its width is less than the width of the opening in the lower section 41 of the support frame. This enables the door 42 to be pivoted outwardly on the hinge 49 to cleaning position, shown in FIG. 4, after the upper hinge bolts 43, which lock the upper hinge portion to the cylinder member 49, are removed. Cleaning of the interior surface of the door 42 is important in order to remove any contamination or deposition materials which become adhered to the inside door surface over time and degrade the cleanliness of the atmosphere within the load locks 22, 24 and within the processing chamber 30.

The essence of the present invention is that the present vertically-slidable automatic door 42 is one which is also horizontally movable or expandable over a slight distance into compression between the inside surface of the flange 40, which functions as a stop member, and the face surface and gasket 38 surrounding the opening 37 to the load lock 22,24 (shown in FIG. 4). This enables the door 42 to be moved to and from raised position without any frictional engagement with the face surface and gasket 38 of the load locks. Sealing engagement only occurs in the horizontal direction when the door 42 is actuated to expand after it is raised vertically to the upper position.

Figure 5:
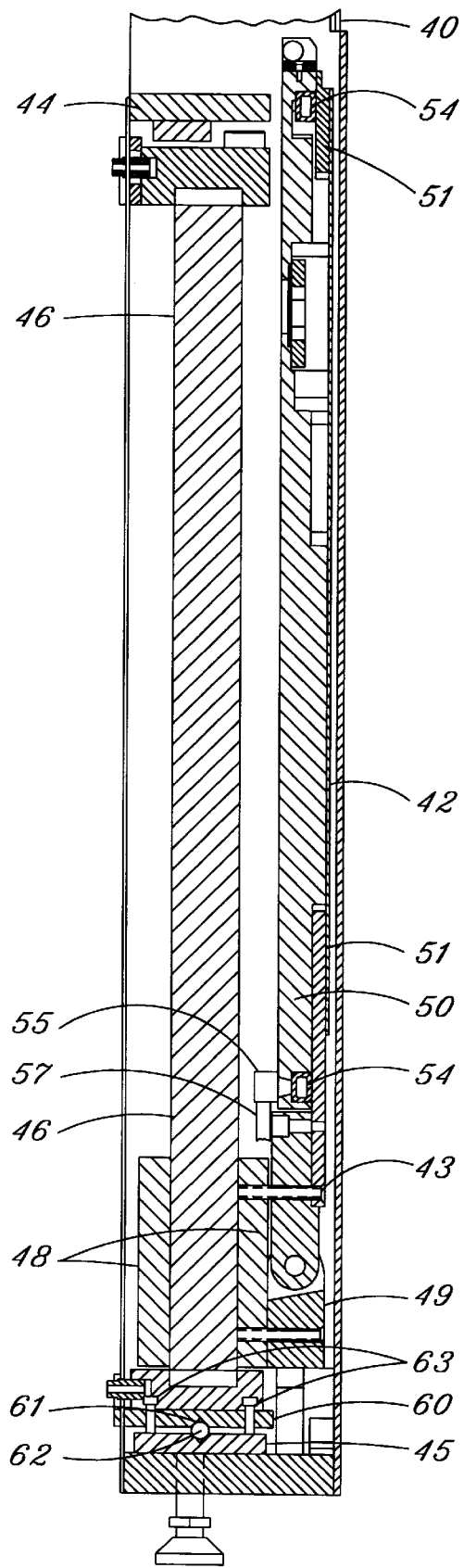
FIG. 5 is a cross-section taken along the line 5—5 of FIG. 3.

The present door 42, according to a preferred embodiment illustrated by FIGS. 3 and 5, comprises an assembly of an inner door panel section 50, an outer door panel section 51 flexibly attached thereto by means of a plurality of leaf springs 52 and spring-biased bolts 53, and an inflatable/deflatable bladder gasket 54, shown most clearly in FIG. 3, set within a continuous recess in the outer face of the inner door section 50 so that the bladder gasket 54 is sandwiched between the inner and outer door sections 50 and 51. The bladder gasket 54 is connected, through a port in the inner door section 50, to a fitting 55 and an automatic inflation air hose 56, shown in FIG. 5, to inflate the bladder gasket 54, force the inner and outer door panel sections uniformly apart and seal the load lock openings 37, shown in FIG. 4, when the door 42 is in the upper position.

The four short leaf springs 52 have their opposed ends attached to the inner and outer door sections, respectively, such as by means of rivets or bolts, to permit the door panel sections to be flexed apart the necessary slight distance when the expansion means, such as the inflatable bladder gasket 54, is activated such as inflated with pressurized air, and to bias the door panel sections 50, 51 to return to substantially contacting position when the expansion means is relaxed, such as by release of the pressurized air to deflate the gasket 54. Also, the leaf springs 52 provide the flexible support to enable the inner door section 51 to interface with the load lock surface, even if not completely parallel thereto.

The four spring-biased bolts 53 through the door panel sections 50 and 51, near the corners thereof, help maintain the sections in alignment with each other as the sections are forced apart and return to surface contact during their horizontal movement into and out of sealing engagement with the port of the processing chamber. The spring-biased bolts permit the panel sections 50 and 51 to be forced apart the necessary short distance when the bladder gasket is inflated, and bias the panel sections to return or contract into surface contact when the bladder gasket 54 is deflated.

In the upper position, shown in FIG. 2, the door 42 is overlapped at the top and the sides by the flange 40 so that inflation of the bladder gasket 54 compresses the bladder between the inner and outer door panel sections 50 and 51 to press the outer door panel section 51 against the inside surface of the surrounding flange 40 and to press the inner door panel section 50 against the face surface of the load lock 15 or 16 and the continuous gasket 38 surrounding to opening 37 to the load lock. This seals the load lock with positive applied pressure to provide an excellent seal whether the atmosphere within the load lock is negative (vacuum) or positive (inert gas at atmospheric pressure).

As illustrated by FIGS. 2 to 4 the inner door panel section 50, shown with the outer door panel section 51 removed in FIG. 3, is a continuous sealing door provided with glass view ports 57 to enable the substrate cassettes 22,24 to be viewed during operation of the apparatus. For this reason, the outer door section 51 is a frame-like panel which leaves the view ports 57 of the inner door section 50 uncovered and provides a peripheral compression plate between the flange 40 and the inflated bladder gasket 54.

According to a preferred embodiment of the present invention, the support frame 36 for the door 42 comprises a pivot support for the pneumatic actuation rod 46 supporting the door 42 in raised position, since the inflation of the bladder gasket 54 causes the door section 50 to separate from door section 51 and move horizontally as the bladder gasket 54 is compressed therebetween. This causes the door section 51, door 42 and its supporting magnetic block 48 to rock or pivot a slight angle, which could produce stress and wear between the block 48 and the cylinder 46. This is avoided by providing a pivot support between the cylinder support block 60 and the lower cross brace 45 of the support frame 46. A suitable pivot support comprises a plurality of notch areas 61 in the undersurface of the support block 60 and a mating plurality of roller bearings 62 recessed in the upper surface of the cross brace 45 along its width, and spring bolts 63 on opposite sides of the pivot, to permit the entire door support assembly to pivot slightly to accommodate the horizontal movement of the door 42 which occurs each time that the bladder gasket 46 is inflated and deflated.

It should be understood that the foregoing description is only illustrative of the invention. Various alternative and modifications can be devices by those skilled in the art without departing from the scope of the invention. Accordingly, the present invention is intended to embrace all such alternative, modifications and variances which fall within the scope of the appended claims.

What is claimed is:

1. A processing chamber having a compact automatic sliding door means for sealing a port of said chamber against leakage in the presence of either a higher internal or external pressure, comprising a door means having an inner panel section, an outer panel section flexibly attached to the inner panel section, and expansion means between said panel sections and activatable to cause said panel sections to be forced apart; support means for supporting said door means for sliding movement into closed position with said inner panel closely spaced from said port, and carrying stop means closely-spaced from the rear surface of said outer door panel when the latter is in closed position, means for sliding said door means on said support means between open and closed position, and means for activating said expansion means when the door means is moved into closed position to compress the outer panel section against the stop means and compress the inner panel section against the port of the processing chamber to seal the latter by the application of positive pressure.

2. A processing chamber according to claim 1 which said support means support said door means for vertical sliding movement between a lower open position and a raised closed position, and said expansion means forces said door panels apart in the horizontal direction to seal the port of the processing chamber.

3. A processing chamber according to claim 1 in which said expansion means comprises a continuous inflatable bladder gasket supported between said inner and outer door panel sections, and means for inflating said bladder gasket to force said door panel sections apart to seal the port, and for deflating said bladder gasket to relax the separation force and unseal the port.

4. A processing chamber according to claim 2 in which said support means for the door means comprises a frame member having attachment means for said processing chamber, adjacent said port, and having foot means, said frame member having elongate vertical side rails, a bottom support rail, an intermediate cross-rail separating the frame member into lower and upper sections, and a top support rail, means mounted between said bottom and intermediate rails for supporting the door means for automatic sliding movement between said lower and upper sections, and flange means on said vertical side rails in the upper section of the frame forming stop means for the door means when the panel sections thereof are forced apart to seal the chamber.

5. A processing chamber according to claim 4 in which the means for supporting the door means comprises a pneumatic cylinder mounted between said bottom and intermediate support rails and containing a magnetic piston, a magnetic block means supported on said cylinder means and magnetically coupled to said piston for vertical movement thereon with said piston, and means for attachment of said door means to said block means for vertical movement of the door means with the block means between the lower and upper sections of the door frame member.

6. A processing chamber according to claim 5 in which the bottom support rail and the cylinder means are attached to each other by a pivot means which allows the cylinder means and the attached door means to pivot a short angle when the door means is expanded to sealed position.

7. A processing chamber according to claim 5 in which the means for supporting to door means also includes a pair of vertical guide rods mounted between the bottom and intermediate support rails, parallel to said pneumatic cylinder.

8. A processing chamber according to claim 5 in which said door means is attached to said magnetic block by a hinge means having an upper plate portion and a lower plate portion, the upper plate portion of the hinge means being releasably attached to the block means to permit the door means to be pivoted outwardly on said hinge means from the support frame for cleaning purposes.

9. A processing chamber according to claim 1 in which the outer panel of the door means is flexibly attached to the inner panel thereof by means of a plurality of leaf springs therebetween, opposed ends of which are attached to said panels, respectively, to permit the panels to be forced apart and to bias the panels to return to contact with each other when the expansion means is deactivated.

10. A processing chamber according to claim 1 in which the inner and outer panels of the door means are flexibly attached to each other by means of plurality of spring-biased bolts which help to maintain the panels in alignment while permitting the panels to be forced apart by the expansion means and biasing the panels to return to contact when the expansion means is deactivated.

* * * * *